Feb. 6, 1951 W. H. FORSTER 2,540,817

BAND-PASS COUPLING NETWORK

Filed Jan. 30, 1947

INVENTOR.
WILLIAM H. FORSTER
BY
Brown, Denk & Synnestvedt
AGENTS

Patented Feb. 6, 1951

2,540,817

UNITED STATES PATENT OFFICE 2,540,817

BAND-PASS COUPLING NETWORK

William H. Forster, Philadelphia, Pa., assignor to Philco Corporation, Philadelphia, Pa., a corporation of Pennsylvania Application January 30, 1947, Serial No. 725,203

3 Claims. (Cl. 179—171)

Figure 1:
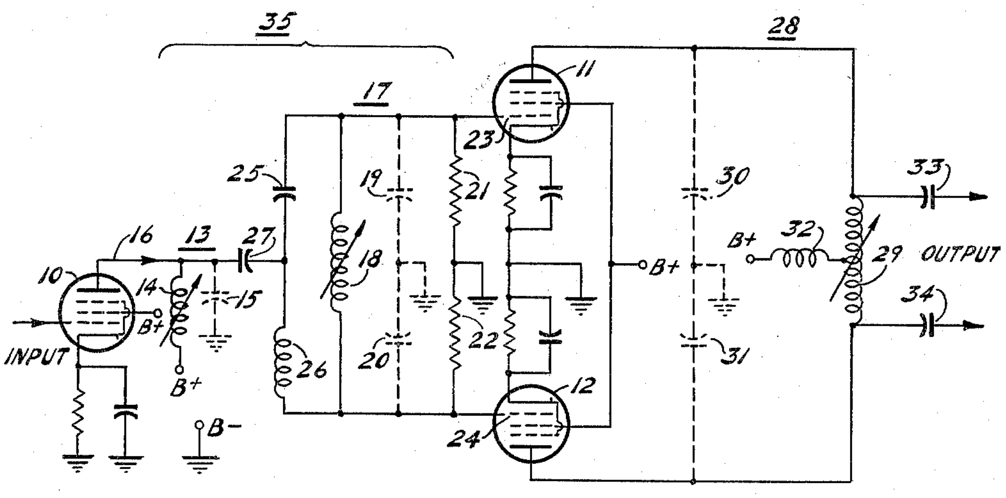

The invention herein described and claimed relates to improved means for coupling together a single-sided electrical circuit and a double-sided or push-pull electrical circuit. (The terms "single-sided" and "double-sided" are herein used to refer to circuits which are sometimes called "single-ended" and "double-ended" circuits respectively, but the former terms will be used throughout this specification.)

The improved means provided by the present invention is adapted to transfer energy in either direction, i. e., the invention contemplates the provision of means adapted to couple a single-sided output circuit to a push-pull input circuit, or to couple a push-pull output circuit to a single-sided input circuit.

The present invention may be utilized to particular advantage in radio amplifier circuits, involving conversion of single-sided signals to push-pull signals and/or of push-pull signals to single-sided signals, where it is desired to amplify, substantially uniformly, a relatively wide band of very high frequencies. The term "wide band" is here used to mean a band whose width is of the order of 10 per cent or more of the nominal carrier frequency.

In very-high-frequency amplifiers of the above types, uniform gain over a wide band is difficult to achieve due to the presence of unwanted distributed capacitances and stray inductances. The magnitude of the distributed capacitances unavoidably present in very-high-frequency circuits frequently precludes the use of capacitance tuning and compels the employment of inductance tuning. But the mere employment of inductance tuning does not insure that adequate gain will be realized since the stray inductances present in the circuit may be large enough to prevent the realization of adequate mutual coupling between stages. For example, if transformer coupling and inductance tuning be employed in a very-high-frequency amplifier involving conversion of single-sided signals to push-pull signals, adequate gain over a wide band is extremely difficult to achieve due to the inability to effect adequate mutual coupling.

I have discovered that substantial improvement in gain is realized over prior art very-high-frequency circuits by coupling the single-sided and push-pull circuits together by a network which includes a pair of reactances of opposite sign connected in a manner to be described. The novel coupling arrangement is also employable at lower frequencies, but the improvement realizable at the lower frequencies over prior art circuits is less than at the higher frequencies.

It is an object of this invention to provide improved means for coupling together a single-sided electrical circuit and a double-sided or push-pull circuit.

It is another object of this invention to provide means adapted to effect improved coupling between a single-sided circuit and a push-pull circuit over a wide band of very high frequencies.

It is one of the specific objects of this invention to provide an improved, very-high-frequency, wide-band, band-pass amplifier stage adapted to convert a single-sided input signal into a push-pull output signal. Such amplifier circuits are frequently referred to as paraphase amplifiers.

Another specific object of this invention is to provide an improved, very-high-frequency, wide-band, band-pass amplifier stage adapted to convert a push-pull input signal into a single-sided output signal.

It is another object of this invention to provide relatively high-impedance coupling means between a single-sided tank circuit and a push-pull tank circuit, thus reducing the deleterious effect of lead inductance and lead capacitance.

Figure 2:
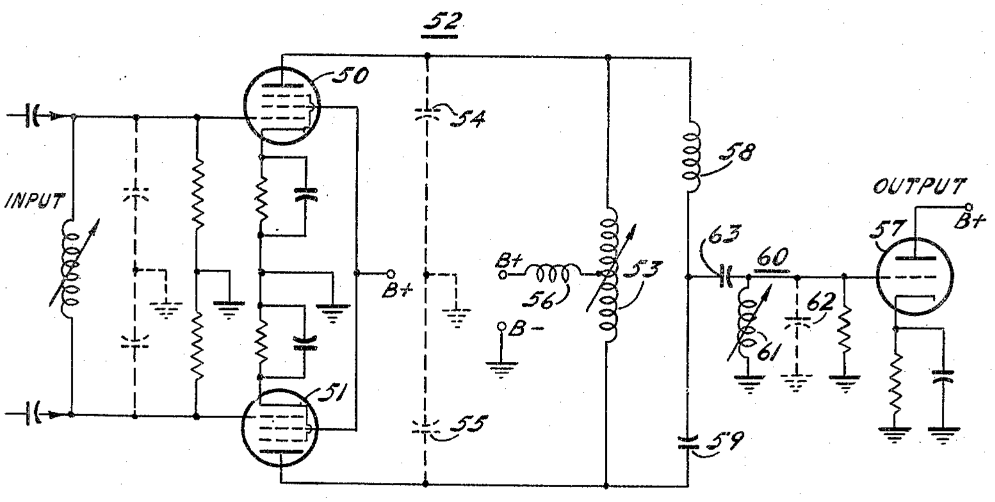

These and other objects, advantages and features of the present invention will become clear from the following detailed description of the specific embodiments which are illustrated in the accompanying drawings, wherein:

Figure 1 is a schematic representation of a paraphase amplifier which includes a preferred embodiment of coupling network adapted to convert a single-sided input signal into a push-pull output signal; and Figure 2 is a schematic representation of a coupling network adapted to convert a push-pull input signal into a single-sided output signal.

Referring to Figure 1, there is shown a paraphase amplifier circuit comprising a source of single-sided signal which is applied to the control grid of pentode 10. The single-sided output signal of tube 10 is converted to a push-pull signal by my novel coupling network 35, and the push-pull signal is applied to the control grids of a pair of pentodes 11 and 12. The single-sided output circuit of tube 10, which also forms the single-sided input portion of coupling networks 35, includes tank circuit 13 comprised of variable inductance 14 and capacitance 15. Variable inductance 14 is connected between plate lead 16 and a source of plate potential, B+. Capacitance 15 may comprise the inherent distributed output capacitance of the plate circuit of tube 10, and is indicated in Figure 1 by a dotted-line representation.

The push-pull output portion of coupling network 35 comprises a tank circuit 17 which includes a number of reactances common to the input circuits of both of the push-pull tubes. These reactances include variable inductance 18, capacitance 19 and capacitance 20. Variable inductance 18 is ungrounded and is connected between control grid 23 of tube 11 and control grid 24 of tube 12. The omission of a ground connection from inductance 18 is deemed important to the satisfactory operation of the coupling network as will be discussed more fully later. Capacitance 19 may comprise the inherent distributed input capacitance of pentode 11, and capacitance 20 may comprise the inherent distributed input capacitance of pentode 12 shunted, if desired, by a fixed or variable capacitor for a purpose subsequently explained.

Resistors 21 and 22, connecting grids 23 and 24 respectively to ground, are damping resistors which tend in known manner to flatten the frequency-response characteristic of the stage over the band of operating frequencies. The damping resistance is preferably placed in the input circuits of the push-pull tubes only, but, if desired, damping resistance may also, or alternatively, be connected in shunt with the single-sided output circuit 13 of pentode 10.

The single-sided output circuit 13 of pentode 10 is susceptance-coupled to the push-pull output portion 17 of the coupling network 35 by means of a coupling capacitor 25 and a coupling inductance 26. (Capacitor 27 is merely a blocking capacitor intended to isolate grid 24 from the high anode-voltage, B+.) Coupling capacitor 25 is connected between a high potential point on output circuit 13 and one end of variable inductance 18, while coupling inductance 26 is connected between the said high potential point and the opposite end of variable inductance 18. In Figure 1, coupling capacitor 25 is shown connected to the upper end of inductance 18, and coupling inductance 26 is shown connected to the lower end of inductance 18, but these coupling elements may be reversed in posiiton, if desired.

For best results, capacitance 25 and inductance 26 are of such value that, at the center frequency of the pass-band, the reactance of capacitor 25 is substantially equal to that of inductance 26. The optimum value of each of these coupling reactances at frequencies within the pass-band is dependent upon the desired width of the pass-band. For wider pass-bands, the coupling reactances are relatively smaller, i. e. the coupling is closer. In many cases, as for example in a case involving a pass-band of the order of 20 per cent of a nominal frequency of the order of 100 megacycles, the value of each of the coupling reactances will be larger than the reactance of the output capacitance 15 of Figure 1 or of either of the input capacitances 19 or 20.

Variable inductance 18 is of such size that its reactance at the center frequency of the pass-band may be so adjusted as to be substantially equal to the series-combined reactances of input capacitances 19 and 20. Resistances 21 and 22 may be of equal magnitude; or if more nearly similar frequency response is desired at grids 23 and 24, resistance 22, on the inductance-coupled side of double-sided circuit 17, may be made larger than resistance 21 in order to compensate for the fact that the Q of the capacitance-coupled side of double-sided circuit 17 will ordinarily be higher than that of the inductance-coupled side. The magnitudes selected for the damping resistances are, of course, dependent upon the amount of flattening desired for the frequency-response characteristic.

The output signals of push-pull tubes 11 and 12 may be combined in any known and suitable manner. In the circuit shown in Figure 1, the output signals of push-pull tubes 11 and 12 are applied to a tank circuit 28 comprised of several reactances which are common to the plate circuits of both of the push-pull tubes. The common reactances include variable inductance 29, capacitance 30 and capacitance 31. Variable inductance 29 is connected between the anodes of tube 11 and 12, and has a center-tap connected to B+ by way of radio-frequency choke 32. The impedance of choke 32 at the operating frequencies is very high so that inductance 29 may be considered ungrounded at radio frequency. Hence, it is not essential that the tap to B+ be precisely from the center of the coil 29. Capacitances 30 and 31 may comprise the inherent distributed output capacitances of the plate circuits of tubes 11 and 12 respectively, and are shown in Figure 1 by dotted line representations. Capacitances 33 and 34 are merely coupling capacitors.

In practicing the invention, a coupling network was built in accordance with the embodiment depicted in Figure 1, and used in the pre-amplifier circuits of a wide-band television relay system. In this system, the coupling network is preceded by a cascade of single-sided amplifiers and is followed by a push-pull power amplifier of several stages. The pass-band of the system is from 105 to 125 mc., i. e. the system has a pass-band of 10 mc. on each side of a center frequency of 115 mc.

In the system referred to above, the tubes which correspond to tubes 10, 11 and 12 of Figure 1 are pentodes, known commercially as type 6AK5. The ontput capacitances of these tubes, which correspond to capacitances 15, 30 and 31 of Figure 1, are of the order of 4.5 $\mu\mu$f. each. The input capacitance of tube 11, and the input capacitance of tube 12, represented in Figure 1 by capacitors 19 and 20, are of the order of 5.5 $\mu\mu$f. each. The variable inductances, corresponding to inductances 14 and 18 shown in Figure 1 are comprised of #29 wire closely wound on one-quarter inch forms. Inductance 14 in the single-sided output circuit of tube 10 is comprised of seven and one-quarter turns, and inductance 18 in the push-pull output circuit of coupling network 35 comprises eight and one-quarter turns. Coupling capacitor 25 which, in combination with inductance 26, couples the single-sided input portion of network 35 to the push-pull output portion of the network, has a value of approximately 1.5 $\mu\mu$f., while coupling inductance 26 has a value of approximately 1.3 $\mu$h. The capacitance of blocking capacitor 27 is 250 $\mu\mu$f.

In determining the desired values of the coupling reactances, as for example, the values of elements 25 and 26 of Figure 1, it is convenient for purposes of making the calculations, to treat the elements as susceptances rather than reactances, and for that reason, I frequently think of my improved coupling as susceptance coupling.

Referring now to Figure 2, there is shown a stage in which the coupling network of the present invention is employed to couple a push-pull circuit to a single-sided circuit. In Figure 2, the output signals of tubes 50 and 51 are applied in push-pull to a double-sided tank circuit 52 comprising variable inductance 53, capacitance 54, and capacitance 55. Radio frequency choke 56 merely provides a conventional means for applying plate voltage to the anodes of the push-pull tubes. The push-pull signal developed across tank circuit 52 is coupled to the single-sided input circuit of tube 57 by means of coupling inductance 58 and coupling capacitance 59. Tank circuit 60, which forms the single-sided output circuit of the coupling network, as well as the single-sided input circuit of tube 57, is comprised of variable inductance 61 and capacitance 62. In the circuit depicted in Figure 2, capacitance 62 represents the inherent distributed input capacitance of tube 57. For best results, coupling elements 58 and 59 are of such value that, at the center frequency of the pass-band, the reactance of inductance 58 is substantially equal to the reactance of capacitance 59. The optimum value of each of these coupling reactances at frequencies within the pass-band is dependent upon the desired width of the pass-band. For wider pass-bands, the coupling reactances are relatively smaller, i. e. the susceptances are larger and the coupling is closer. In many cases involving high frequencies and inductance tuning, the value of each of the coupling reactances 58 and 59 is larger than, or at least as large as, the reactance of either of the output capacitances 54 or 55, or of input capacitance 62.

In practicing the invention, an amplifier stage was built substantially in accordance with the embodiment depicted in Figure 2, and used as a part of the power amplifier of the same wide-band television relay system mentioned previously in connection with Figure 1. The power amplifier referred to comprises two push-pull stages, the second of which comprises the left hand portion of Figure 2. And as shown in Figure 2, coupling from push-pull to a single-sided circuit is accomplished by means of my improved coupling network.

The power amplifier referred to above has a pass-band of 20 mc., extending from 105 to 125 mc. The second stage of this amplifier comprises a dual pentode, known commercially as type 829B; this dual-unit tube corresponds to pentodes 50 and 51 of Figure 2. The output capacitance of each unit of this tube is of the order of 7.0 $\mu\mu$f. and is represented in Figure 2 by capacitances 54 and 55. Variable inductance 53 comprises seven turns of #23 wire and has a center-tap which may, or may not, be at the mid-point. Choke 56 offers a very high impedance to frequencies within the pass-band so that inductance 53 may be considered to be ungrounded at the operating frequency. Coupling inductance 58 has a value of approximately 0.32 $\mu$h., while coupling capacitance 59 has a value of approximately 6 $\mu\mu$f. The capacitance of blocking capacitor 63 is 250 $\mu\mu$f.

Tube 57 may be any tube suitable for the particular application. In the specific application being described, tube 57 is comprised of a cavity resonator, housing a pair of lighthouse triodes, type 2C39, whose grids are driven in parallel. The total input capacitance of these tubes, represented in Figure 2 by capacitance 62, is of the order of 55 $\mu\mu$f. Inductance, corresponding to inductance 61 of Figure 2, is within the cavity resonator and is resonated with the grid capacitance.

I have described the structure of my improved coupling network and I have set forth certain details regarding circuits which have been actually built and used in accordance with my invention. The gain and frequency response of the circuits which are in use are very satisfactory and represent definite improvements over prior art circuits. The frequency response obtained over the pass-band extending from 105 to 125 mc. is substantially symmetrical having two peaks of substantially equal value with a dip-response therebetween.

In operation, the network is the equivalent of a pair of double-tuned circuits arranged in parallel, as will now be described. The single-sided tank circuit, as for example, circuit 13 of Figure 1, although physically a unitary circuit, may be considered, for purposes of theoretical analysis, to be comprised of a pair of tank circuits in parallel, each having an inductive branch of twice the magnitude of inductance 14 and each having a capacitive branch of one-half the magnitude of capacitance 15.

Similarly, double-sided tank circuit 17 of Figure 1 may be considered to be comprised of two tank circuits, i. e., an upper circuit comprising capacitance 19 and the upper portion of inductance 18, and a lower circuit comprising capacitance 20 and the lower portion of inductance 18. However, the said upper and lower portions of inductance 18 are not equal except perhaps at one frequency within the pass-band, that is, the electrical center of inductance 18 varies as the frequency varies; and the location of the electrical center is affected by the presence of coupling capacitance 25 in the upper circuit and of coupling inductance 26 in the lower circuit.

It is seen then that coupling network 35 of Figure 1 functions as a pair of double-tuned circuits connected in parallel, one of the double-tuned circuits being comprised of a fictional one-half of single-sided tank circuit 13 and the upper portion of double-sided tank circuit 17 coupled together by capacitive reactance 25, and the other double-tuned circuit comprising the other one-half of single-sided tank circuit 13 and the lower portion of double-sided tank circuit 17 coupled together by inductive reactance 26.

The input impedances of both of the above double-tuned circuits have substantially the same frequency response. The transfer impedances which determine the signals on control grids 23 and 24 are substantially 180° apart. For wide-band operation, the magnitudes of the transfer impedances may be unequal at most frequencies within the pass-band due to the fact that the total capacitance of each of the fictional double-tuned circuits may be unequal; but the phases will always be substantially 180° apart. If desired, the transfer impedances may be made substantially equal by suitable compensating means, as by adding capacitance to the side having the smaller capacitance. For example, capacitance 20 of Figure 1 may be made larger than capacitance 19, as by placing the leads of control grid 24 closer to chassis, or by the addition of a fixed or variable capacitor between control grid 24 and ground. Resistances 21 and 22 should in general be chosen to give equal G's to the two halves of circuit 17.

It is not disadvantageous, however, to permit the transfer impedances to remain somewhat unbalanced, particularly in applications involving recombining of push-pull signals to single-sided signals, as will be described more fully.

In the television relay system referred to previously, in which the pass-band is of the order of 17.3% of the nominal carrier frequency, the amplitude unbalances in the stage corresponding to Figure 1 are of the order of 35%; and the unbalance was substantially constant at all frequencies within the pass-band. It was not deemed necessary to balance the transfer impedances to achieve amplitude balance in the stage referred to since neither of the push-pull tubes is overloaded. The percentage of amplitude unbalance will vary, of course, with the width of the pass-band; in general, the amplitude unbalance will be approximately twice as large as the bandwidth, both values being expressed in terms of percentage.

I have indicated above that the frequency-response characteristic of the circuit of Figure 1 is substantially symmetrical about the mean frequency. I have also indicated one manner in which amplitude unbalances may be reduced, if desired. At the same time, I have made it clear that amplitude unbalance of a reasonable magnitude may exist without disturbing the satisfactory operation of the circuit.

In many cases, the overall system will require the conversion of single-sided signals to push-pull and the subsequent reconversion or recombining of the push-pull signals to single-sided signals. In such cases, improved performance may be realized by reversing the positions of the coupling reactances in the two conversion stages. To illustrate this point, assume that the push-pull output signals of the circuit of Figure 1 are applied to the input of the circuit of Figure 2, either directly or by way of intervening circuits. Assume further that a relatively small but noticeable amplitude unbalance obtains in the circuit of Figure 1 such that the signals on grid 24 of tube 12 are somewhat greater in magnitude than the signals on grid 23 of tube 11. If this be the case, then the signals applied to push-pull tubes 50, 51 of Figure 2 will be of unequal amplitude. It is known that in the design of push-pull amplifiers it is desirable to have equal signals on the plates of the push-pull tubes in order that the optimum plate supply voltage may be employed. In the system being discussed equal or balanced plate signals may be achieved even though the input signals to the push-pull tubes be of unequal magnitude. This may be accomplished by arranging the coupling reactances 58, 59 in a reverse manner from that employed in Figure 1. That is to say, if in Figure 1 the source of single-sided signals be coupled capacitively to the upper side of the push-pull circuit, then the upper side of push-pull output circuit of Figure 2 is preferably coupled inductively to the single-sided output circuit of Figure 2; and the lower side of the push-pull circuit, which is inductively coupled in Figure 1 to the single-sided source, is capacitively coupled in Figure 2 to the single-sided output circuit. Thus arranged, tube 51 of Figure 2, upon whose grid signals of larger amplitude have been assumed to be impressed, works into a load circuit of slightly lower impedance than does tube 50; hence tube 51 provides slightly lower gain than does tube 50, thus tending to compensate for the slight unbalance in the amplitudes of the applied signals.

Referring again to Figure 1, it has been stated previously that the omission of a ground connection from inductance 18 is important to the optimum operation of the circuit shown. There are several reasons why it is not desirable to return the physical center of inductance 18 to ground. In the first place, if inductance 18 were grounded the output portion of coupling network 35 would be comprised of two separate tank circuits, each tuned to resonance by one of the grid-input capacitances, and the amplitude unbalances on the grids of push-pull tubes 11 and 12 would vary widely at different frequencies within the pass-band, whereas with inductance 18 ungrounded it has been found that the amplitude unbalances remain substantially constant over the pass-band. A second reason for not returning inductance 18 to ground is that the tuning of the circuit is simplified. Observe that with inductance 18 not grounded the tuning problem is reduced to that of tuning a double-tuned circuit involving inductances 14 and 18; but if inductance 18 be grounded the problem becomes that of tuning a triple-tuned circuit, a considerably more difficult task. Moreover, with inductance 18 ungrounded there is no danger of mistuning tank circuit 17 with respect to the upper and lower portions; whereas, if the upper and lower portions be separately tuned, the possibility of mistuning is ever present. A third reason is that with inductance 18 not grounded the relatively strong currents which circulate within tank circuit 17 are excluded from chassis, whereas, if inductor 18 be connected at its mid-point to chassis, circulating currents in each of the two tank circuits, thus formed, would pass through parts of the chassis setting up in said chassis R.-F. voltages easily capable of effecting regeneration in combination with other stages mounted on the same chassis. Moreover, chassis impedances would be introduced in the tank circuits with resultant losses in gain.

Having described my invention, I claim:

1. A double-tuned coupling network adapted to pass a wide band of very high frequencies and to interconnect a single-sided circuit and a push-pull circuit, said interconnecting coupling network comprising: a single-sided first tuned circuit tuned by a first inductance to substantially the center frequency of the passband; a double-sided second tuned circuit tuned by a second inductance to said substantially center frequency; a capacitive reactance coupling a high potential point of said single-sided tuned circuit and one side of said double-sided tuned circuit; and an inductive reactance having substantially the same magnitude at said center frequency as said capacitive reactance coupling said high potential point of said single-sided tuned circuit and the other side of said double-sided tuned circuit.

2. A double-tuned amplifier adapted to pass a wide band of very high frequencies, said amplifier comprising: a first amplifier tube; second and third tubes comprising a pair of push-pull amplifier tubes; a single-sided output tank circuit for said first tube, said output tank circuit being tuned by a first inductance to substantially the center frequency of the passband; a double-sided input tank circuit for said push-pull tubes, said input tank circuit being tuned by a second inductance to said substantially center frequency; a capacitive reactance coupling a high potential point of said single-sided output tank circuit to one side of said double-sided input tank circuit; and an inductive reactance of substantially the same magnitude at said center frequency as said capacitive reactance coupling said high potential point of said single-sided output tank circuit to the other side of said double-sided input tank circuit.

3. A double-tuned amplifier adapted to pass a wide band of very high frequencies, said amplifier comprising: first and second tubes comprising a pair of push-pull amplifier tubes; a third amplifier tube; a double-sided output tank circuit for said push-pull tubes, said output tank circuit being tuned by a first inductance to substantially the center frequency of the passband; a single-sided input tank circuit for said third tube, said input tank circuit being tuned by a second inductance to said substantially center frequency; a capacitive reactance coupling one side of said double-sided output tank circuit to a high potential point of said single-sided input tank circuit; and an inductive reactance of substantially the same magnitude at said center frequency as said capacitive reactance coupling the other side of said double-sided output tank circuit to said high potential point of said single-sided input tank circuit.

WILLIAM H. FORSTER.

REFERENCES CITED

The following references are of record in the file of this patent:

UNITED STATES PATENTS

| Number | Name | Date |
|---|---|---|
| 1,936,438 | Roder | Nov. 21, 1933 |
| 1,998,322 | Kaar | Apr. 16, 1935 |
| 2,270,539 | Malling | Jan. 20, 1942 |
| 2,276,952 | Franklin | Mar. 17, 1942 |
| 2,359,618 | Byrne | Oct. 3, 1944 |

Certificate of Correction

Patent No. 2,540,817

February 6, 1951

WILLIAM H. FORSTER

It is hereby certified that error appears in the printed specification of the above numbered patent requiring correction as follows:

Column 2, line 47, for the word "networks" read *network*; column 4, line 42, for "ontput" read *output*; column 6, line 66, for "G's" read *Q's*;

and that the said Letters Patent should be read as corrected above, so that the same may conform to the record of the case in the Patent Office.

Signed and sealed this 14th day of August, A. D. 1951.

[SEAL]

THOMAS F. MURPHY,
*Assistant Commissioner of Patents.*